(12) United States Patent
Kim

(10) Patent No.: US 11,169,562 B1
(45) Date of Patent: Nov. 9, 2021

(54) ELECTRONIC DEVICES FOR CONTROLLING CLOCK GENERATION

(71) Applicant: SK hynix Inc., Icheon-si (KR)

(72) Inventor: Woongrae Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/991,754

(22) Filed: Aug. 12, 2020

(30) Foreign Application Priority Data

May 7, 2020 (KR) .................. 10-2020-0054289

(51) Int. Cl.
| | | |
|---|---|---|
| *G11C 7/22* | (2006.01) | |
| *G06F 1/08* | (2006.01) | |
| *H03L 7/07* | (2006.01) | |
| *H03L 7/08* | (2006.01) | |
| *G06F 1/12* | (2006.01) | |

(52) U.S. Cl.
CPC .................. *G06F 1/08* (2013.01); *G06F 1/12* (2013.01); *G11C 7/22* (2013.01); *G11C 7/222* (2013.01); *H03L 7/07* (2013.01); *H03L 7/0802* (2013.01)

(58) Field of Classification Search
CPC ....................................................... G11C 7/22
USPC ............................................................ 365/194
See application file for complete search history.

(56) References Cited

U.S. PATENT DOCUMENTS

| 9,536,591 B1 * | 1/2017 | Kwak .................. G11C 29/028 |
|---|---|---|
| 10,438,650 B1 | 10/2019 | Yamashita et al. |
| 2004/0027902 A1 | 2/2004 | Ooishi et al. |

FOREIGN PATENT DOCUMENTS

KR     1020200055930 A     5/2020

* cited by examiner

*Primary Examiner* — Jason Lappas
(74) *Attorney, Agent, or Firm* — William Park & Associates Ltd.

(57) ABSTRACT

An electronic device includes a latch clock generation circuit, a command decoder, and a latency shifting circuit. The latch clock generation circuit generates a latch clock based on a chip selection signal. The command decoder generates an internal operation signal from an internal chip selection signal and an internal command generated based on the latch clock. The latency shifting circuit generates an end signal by shifting the internal operation signal in synchronization with a shifting clock by a period corresponding to a latency while an internal operation is performed.

23 Claims, 17 Drawing Sheets

ELECTRONIC DEVICES FOR CONTROLLING CLOCK GENERATION

CROSS-REFERENCE TO RELATED APPLICATIONS

The present application claims priority under 35 U.S.C. 119(a) to Korean Patent Application No. 10-2020-0054289, filed on May 7, 2020, which is incorporated herein by reference in its entirety.

BACKGROUND

1. Technical Field

Embodiments of the present disclosure relate to electronic devices for controlling clock generation.

2. Related Art

Semiconductor devices may receive commands to perform various internal operations including an active operation, a write operation, a read operation, and a pre-charge operation. Recently, in the case of semiconductor devices applied to mobile systems, a power-down mode capable of interrupting generation of a clock used for an internal operation has been provided to reduce power consumption. However, because the semiconductor devices have to receive commands to perform various internal operations, it may be difficult to completely interrupt the generation of the clock as the generation of the cock is interrupted in the power-down mode. Accordingly, the semiconductor devices generate the clock for receiving commands necessary for the internal operation in a standby mode.

SUMMARY

According to an embodiment, an electronic device includes a latch clock generation circuit, a command decoder, and a latency shifting circuit. The latch clock generation circuit is configured to generate a latch clock based on a chip selection signal. The command decoder is configured to generate an internal operation signal from an internal chip selection signal and an internal command generated based on the latch clock. The latency shifting circuit is configured to generate an end signal by shifting the internal operation signal in synchronization with a shifting clock by a period corresponding to a latency while an internal operation is performed.

According to another embodiment, an electronic device includes a detection signal generation circuit, a latch clock generation circuit, and a command decoder. The detection signal generation circuit is configured to generate a detection signal that is activated from a point in time when a chip selection signal is activated until a point in time when a period set by an internal clock elapses from the point in time when a chip selection signal is activated. The latch clock generation circuit is configured to generate a latch clock from the detection signal and the internal clock. The command decoder is configured to generate an internal operation signal from an internal chip selection signal and an internal command which are generated based on the latch clock.

According to yet another embodiment, an electronic device includes a latch clock generation circuit, a command decoder, and a latency shifting circuit. The latch clock generation circuit is configured to generate a first latch clock and a second latch clock based on a chip selection signal. The command decoder is configured to generate a first internal operation signal and a second internal operation signal from a first internal chip selection signal, a second internal chip selection signal, a first internal command, and a second internal command which are generated based on the first latch clock and the second latch clock. The latency shifting circuit is configured to generate a first end signal and a second end signal by shifting the first internal operation signal and the second internal operation signal in synchronization with a first shifting clock and a second shifting clock by a period corresponding to a latency while an internal operation is performed.

DETAILED DESCRIPTION OF THE EMBODIMENTS

In the following description of embodiments, when a parameter is referred to as being "predetermined," it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first," "second," "third," etc. are used herein to describe various elements, these elements should not be limited by these terms. These terms are only used to distinguish one element from another element and are not intended to imply an order or number of elements. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage correspond to a signal having a logic "high" level, a signal having a second voltage correspond to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment.

Various embodiments of the present disclosure will be described hereinafter in detail with reference to the accompanying drawings. However, the embodiments described herein are for illustrative purposes only and are not intended to limit the scope of the present disclosure.

Figure 1:
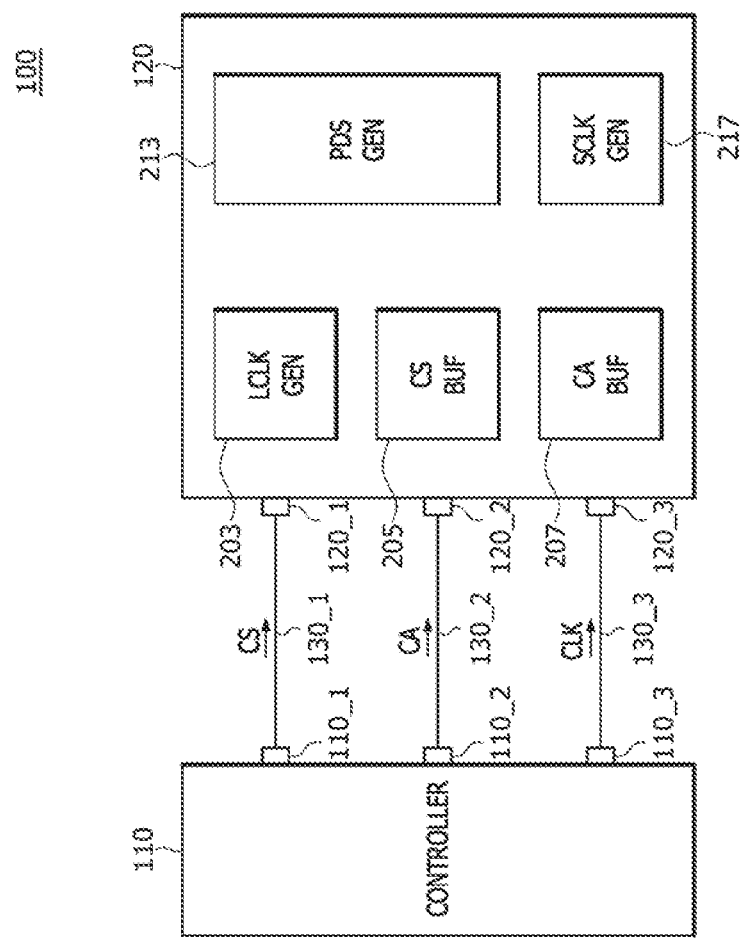
FIG. 1 is a block diagram illustrating a configuration of an electronic system according to an embodiment of the present disclosure.

FIG. 1 is a block diagram illustrating a configuration of an electronic system 100 according to an embodiment of the present disclosure. As illustrated in FIG. 1, the electronic system 100 may include a controller 110 and an electronic device 120. The controller 110 may include a first control pin 110_1, a second control pin 110_2, and a third control pin 110_3. The electronic device 120 may include a first device pin 120_1, a second device pin 120_2, and a third device pin 120_3. The controller 110 may transmit a chip selection signal CS to the electronic device 120 through a first transmission line 130_1 connected between the first control pin 110_1 and the first device pin 120_1. The controller 110 may transmit a command CA to the electronic device 120 through a second transmission line 130_2 connected between the second control pin 110_2 and the second device pin 120_2. The controller 110 may transmit a clock CLK to the electronic device 120 through a third transmission line 130_3 connected between the third control pin 110_3 and the third device pin 120_3. The electronic system 100 may be configured to transmit the command CA including an address through the second transmission line 130_2 connected between the second control pin 110_2 and the second device pin 120_2 according to the embodiments.

The electronic device 120 may be a semiconductor device. The electronic device 120 may receive the chip selection signal CS, the command CA, and the clock CLK from the controller 110 to perform various internal operations including an active operation, a write operation, a read operation, and a pre-charge operation. The electronic device 120 may include a latch clock generation circuit (LCLK GEN) 203 that detects a time when the chip selection signal CS is activated to activate a latch clock (LCLK of FIG. 2). The electronic device 120 may include a chip selection signal buffer circuit (CS BUF) 205 and a command buffer circuit (CA BUF) 207 to latch the chip selection signal CS and the command CA when the latch clock LCLK is activated. Accordingly, the electronic device 120 according to the present embodiment may reduce power consumption, which is due to the latch clock LCLK unnecessarily activated before the chip selection signal CS is activated, by activating the latch clock LCLK for latching the chip selection signal CS and the command CA after the chip selection signal CS is activated. The electronic device 120 may include a period signal generation circuit (PDS GEN) 213 and a shifting clock generation circuit (SCLK GEN) 217 capable of activating a shifting clock (SCLK in FIG. 2) for setting a write latency and a read latency after the chip selection signal CS is activated. Accordingly, the electronic device 120 according to the present embodiment may reduce power consumption during the read operation and the write operation by activating the shifting clock SCLK after the chip selection signal CS is activated.

Figure 2:
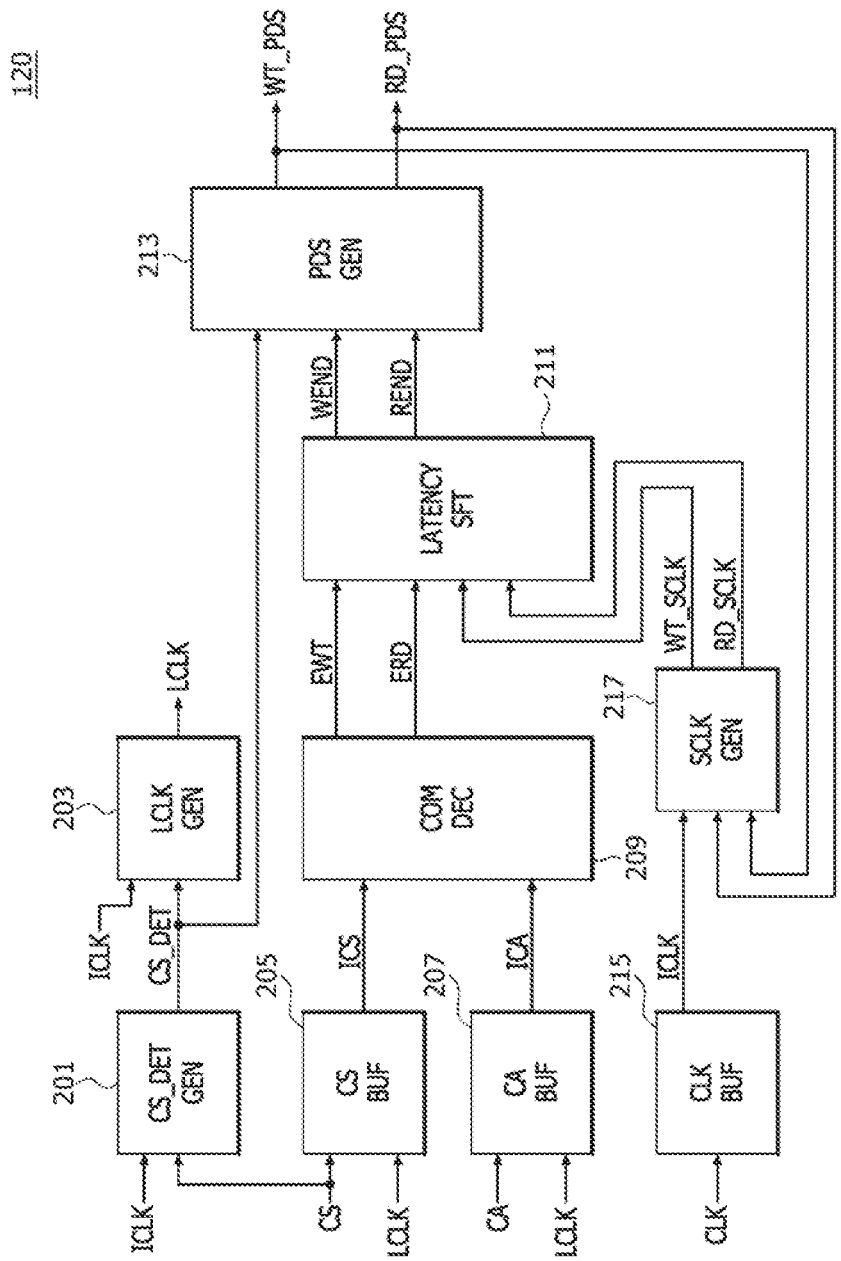
FIG. 2 is a block diagram illustrating a configuration of an electronic device included in the electronic system illustrated in FIG. 1.

FIG. 2 is a block diagram illustrating a configuration the electronic device 120. As illustrated in FIG. 2, the electronic device 120 may include a detection signal generation circuit (CS_DET GEN) 201, the latch clock generation circuit (LCLK GEN) 203, the chip selection signal buffer circuit (CS BUF) 205, the command buffer circuit (CA BUF) 207, a command decoder (COM DEC) 209, a latency shifting circuit (LATENCY SFT) 211, the period signal generation circuit (PDS GEN) 213, a clock buffer circuit (CLK BUF) 215, and the shifting clock generation circuit (SCLK GEN) 217.

The detection signal generation circuit 201 may generate a detection signal CS_DET based on an internal clock ICLK and the chip selection signal CS. The detection signal generation circuit 201 may activate the detection signal CS_DET when the chip selection signal CS is activated. The chip selection signal CS may be activated by maintaining a predetermined logic level during a predetermined period. For example, the chip selection signal CS may be activated by maintaining a logic "high" level for one cycle of the clock CLK. A logic level of the chip selection signal CS which is activated may be set to be different according to the embodiments. In addition, a period of the chip selection signal CS which is activated may be set to be different according to the embodiments. The detection signal CS_DET may be activated to have the predetermined logic level. For example, the detection signal CS_DET may be activated to have a logic "high" level. When the chip selection signal CS is inactivated after being activated, the detection signal CS_DET may be inactivated at a point in time when a predetermined number of cycles of the internal clock ICLK elapse from a point in time when the chip selection signal CS is inactivated. For example, the detection signal CS_DET may be inactivated at a point in time when two cycles of the internal clock ICLK elapse from a point in time when the chip selection signal CS is inactivated.

The latch clock generation circuit 203 may generate the latch clock LCLK based on the detection signal CS_DET and the internal clock ICLK. The latch clock generation circuit 203 may buffer the internal clock ICLK to output the buffered signal of the internal clock ICLK as the latch clock LCLK when the detection signal CS_DET is activated. The latch clock generation circuit 203 may activate the latch clock LCLK while the detection signal CS_DET is activated.

The chip selection signal buffer circuit 205 may generate an internal chip selection signal ICS based on the latch clock LCLK and the chip selection signal CS. The chip selection signal buffer circuit 205 may latch the chip selection signal CS to output the latched signal of the chip selection signal CS as the internal chip selection signal ICS when the latch clock LCLK is activated. The chip selection signal buffer circuit 205 might latch the chip selection signal CS only when the latch clock LCLK is activated, thereby reducing power consumption.

The command buffer circuit 207 may generate an internal command ICA based on the latch clock LCLK and the command CA. When the latch clock LCLK is activated, the command buffer circuit 207 may latch the command CA to output the latched signal of the command CA as the internal command ICA. The command buffer circuit 207 might latch the command CA only when the latch clock LCLK is activated, thereby reducing power consumption.

The command decoder 209 may generate an internal operation signal based on the internal chip selection signal ICS and the internal command ICA. The internal operation signal may include a write signal EWT and a read signal ERD. The command decoder 209 may generate the write signal EWT and the read signal ERD by decoding the internal command ICA based on the internal chip selection signal ICS. The command decoder 209 may activate the write signal EWT and the read signal ERD by decoding the internal command ICA sequentially inputted based on the internal chip selection signal ICS. For example, the write signal EWT may be activated when the internal command ICA having a first logic level combination is inputted based on the internal chip selection signal ICS, and the read signal ERD may be activated when the internal command ICA having a second logic level combination is inputted based on the internal chip selection signal ICS. The write signal EWT may be activated during the write operation. The read signal ERD may be activated during the read operation. For example, each of the write signal EWT and the read signal ERD may be activated to provide a pulse having a logic "high" level.

The latency shifting circuit 211 may generate end signals based on the write signal EWT, the read signal ERD, a write shifting clock WT_SCLK, and a read shifting clock RD_SCLK. The end signals may include a write end signal WEND and a read end signal REND. The latency shifting circuit 211 may generate the write end signal WEND that maintains an inactivated state from a point in time when the write signal EWT is activated until a point in time when a period set by a write latency elapses from a point in time when the write signal EWT is activated. The write end signal WEND may be activated while the write operation is not performed. For example, the write end signal WEND may be activated to have a logic "high" level while the write operation is not performed and may be inactivated to have a logic "low" level while the write operation is performed. The write end signal WEND may maintain an inactivated state during a period set by the write latency through a shifting operation performed based on the write shifting clock WT_SCLK. The latency shifting circuit 211 may generate the read end signal REND maintaining an inactivated state from a point in time when the read signal ERD is activated until a point in time when a period set by a read latency based on the read shifting clock RD_SCLK elapses from a point in time when the read signal ERD is activated. The read end signal REND may be activated while the read operation is not performed. For example, the read end signal REND may be activated to have a logic "high" level while the read operation is not performed and may be inactivated to have a logic "low" level while the read operation is performed. The read end signal REND may maintain an inactivated state during a period set by the read latency through a shifting operation based on the read shifting clock RD_SCLK.

The period signal generation circuit 213 may generate period signals based on the detection signal CS_DET, the write end signal WEND, and the read end signal REND. The period signals may include a write period signal WT_PDS and a read period signal RD_PDS. The period signal generation circuit 213 may activate the write period signal WT_PDS and the read period signal RD_PDS when the detection signal CS_DET is activated. The period signal generation circuit 213 may inactivate the write period signal WT_PDS when the detection signal CS_DET is inactivated and the write end signal WEND is activated. The write period signal WT_PDS may be activated during a relatively longer period when the write operation is performed, as compared with the cases that the active operation, the read operation, and the pre-charge operation are performed. The period signal generation circuit 213 may inactivate the read period signal RD_PDS when the detection signal CS_DET is inactivated and the read end signal REND is activated. The read period signal RD_PDS may be activated during a relatively longer period when the read operation is performed, as compared with the cases that the active operation, the write operation, and the pre-charge operation are performed.

The clock buffer circuit 215 may generate the internal clock ICLK based on the clock CLK. The clock buffer circuit 215 may generate the internal clock ICLK by buffering the clock CLK. According to the embodiments, the clock buffer circuit 215 may also generate the internal clock ICLK by dividing the clock CLK.

The shifting clock generation circuit 217 may generate shifting clocks based on the internal clock ICLK, the write period signal WT_PDS, and the read period signal RD_PDS. The shifting clocks may include the write shifting clock WT_SCLK and the read shifting clock RD_SCLK. The shifting clock generation circuit 217 may buffer the internal clock ICLK to output the buffered signal of the internal clock ICLK as the write shifting clock WT_SCLK while the write period signal WT_PDS is activated. The shifting clock generation circuit 217 may buffer the internal clock ICLK to output the buffered signal of the internal clock ICLK as the read shifting clock RD_SCLK while the read period signal RD_PDS is activated.

Figure 3:
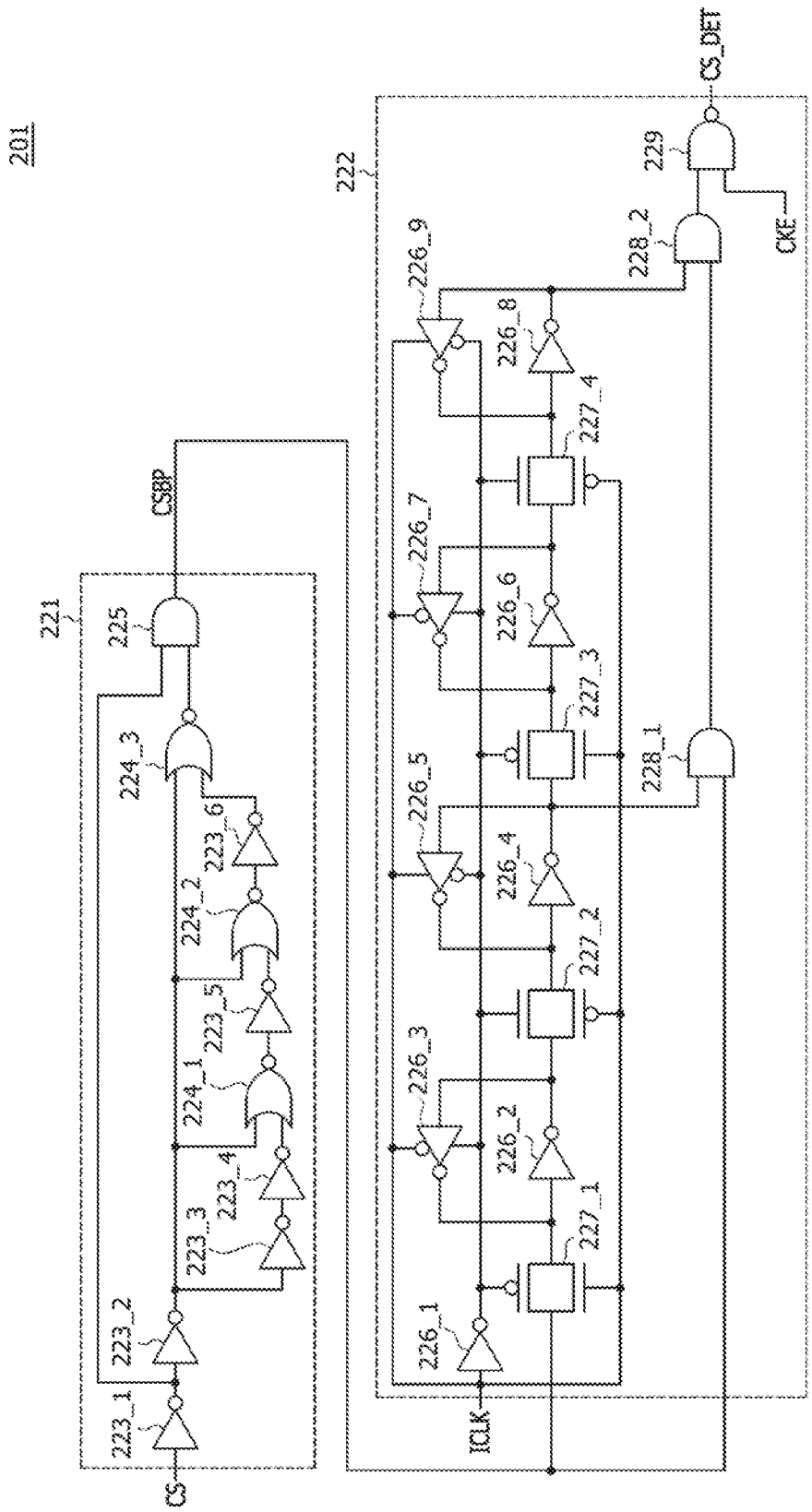
FIG. 3 is a circuit diagram illustrating a detection signal generation circuit included in the electronic device illustrated in FIG. 2.

FIG. 3 is a circuit diagram illustrating an example of the detection signal generation circuit 201. As illustrated in FIG. 3, the detection signal generation circuit 201 may include a chip selection pulse generation circuit 221 and a detection signal output circuit 222.

The chip selection pulse generation circuit 221 may include inverters 223_1 to 223_6, NOR gates 224_1 to 224_3, and an AND gate 225. The inverter 223_1 may inversely buffer the chip selection signal CS. The inverter 223_2 may inversely buffer an output signal of the inverter 223_1. The inverter 223_3 may inversely buffer an output signal of the inverter 223_2. The inverter 2234 may inversely buffer an output signal of the inverter 223_3. The NOR gate 224_1 may receive the output signal of the inverter 223_2 and an output signal of the inverter 2234 to perform a logical NOR operation. The inverter 223_5 may inversely buffer an output signal of the NOR gate 224_1. The NOR gate 224_2 may receive the output signal of the inverter 223_2 and an output signal of the inverter 2235 to perform a logical NOR operation. The inverter 2236 may inversely buffer an output signal of the NOR gate 224_2. The NOR gate 224_3 may receive the output signal of the inverter 223_2 and an output signal of the inverter 223_6 to perform a logical NOR operation. The AND gate 225 may receive the output signal of the inverter 223_1 and an output signal of the NOR gate 224_3 to perform a logical AND operation. The chip selection pulse generation circuit 221 may generate a chip selection pulse signal CSBP having a logic "low" level when the chip selection signal CS is activated so that a logic level of the chip selection signal CS changes from a logic "low" level into a logic "high" level. If the chip selection signal CS is inactivated so that a logic level of chip selection signal CS changes from a logic "high" level into a logic "low" level, the chip selection pulse generation circuit 221 may change a logic level of the chip selection pulse signal CSBP from a logic "low" level into a logic "high" level at a point in time when a period set by the inverters 223_1 to 223_6, the NOR gates 224_1 to 2243, and the AND gate 225 elapses from a point in time when the chip selection signal CS is inactivated.

The detection signal output circuit 222 may include inverters 226_1 to 226_9, transfer gates 227_1 to 2274, AND gates 228_1 and 2282, and a NAND gate 229. The inverter 226_1 may inversely buffer the internal clock ICLK. The transfer gate 227_1 may be turned on to transmit the chip selection pulse signal CSBP when the internal clock ICLK has a logic "high" level. The inverters 226_2 and 226_3 may inversely buffer an output signal of the transfer gate 227_1 and may latch the output signal of the transfer gate 227_1 when the internal clock ICLK has a logic "low" level. The transfer gate 227_2 may be turned on to transmit an output signal of the inverter 226_2 when the internal clock ICLK has a logic "low" level. The inverters 226_4 and 226_5 may inversely buffer an output signal of the transfer gate 227_2 and may latch the output signal of the transfer gate 227_2 when the internal clock ICLK has a logic "high" level. The transfer gate 227_3 may be turned on to transmit an output signal of the inverter 226_4 when the internal clock ICLK has a logic "high" level. The inverters 226_6 and 226_7 may inversely buffer an output signal of the transfer gate 227_3 and may latch the output signal of the transfer gate 227_3 when the internal clock ICLK has a logic "low" level. The transfer gate 227_4 may be turned on to transmit the output signal of the inverter 226_6 when the internal clock ICLK has a logic "low" level. The inverters 226_8 and 226_9 may inversely buffer an output signal of the transfer gate 227_4 and may latch the output signal of the transfer gate 227_4 when the internal clock ICLK has a logic "high" level. The AND gate 228_1 may receive the chip selection pulse signal CSBP and an output signal of the inverter 2264 to perform a logical AND operation. The AND gate 228_2 may receive an output signal of the AND gate 228_1 and an output signal of the inverter 226_8 to perform a logical AND operation. The NAND gate 229 may receive a clock enable signal CKE and an output signal of the AND gate 228_2 to perform a logical NAND operation. The clock enable signal CKE may be generated to have a logic "high" level out of the power-down mode and may be generated to have a logic "low" level in the power-down mode. The detection signal output circuit 222 may generate the detection signal CS_DET which is activated to have a logic "high" level based on the clock enable signal CKE having a logic "low" level in the power-down mode. The detection signal CS_DET has to be activated in the power-down mode because the electronic device 120 has to receive the command CA to exit the power-down mode. The detection signal output circuit 222 may generate the detection signal CS_DET activated to have a logic "high" level when the chip selection pulse signal CSBP has a logic "low" level. The detection signal output circuit 222 may inactivate the detection signal CS_DET into a logic "low" level at point in time when two cycles of the internal clock ICLK elapse from a point in time when a logic level of the chip selection pulse signal CSBP changes from a logic "low" level into a logic "high" level.

The detection signal generation circuit 201 having the aforementioned configuration may activate the detection signal CS_DET to a logic "high" level when the electronic device 120 enters the power-down mode or when the chip selection signal CS is activated to have a logic "high" level and may inactivate the detection signal CS_DET to a logic "low" level at a point in time when two cycles of the internal clock ICLK elapse from a point in time when the chip selection signal CS is inactivated to have a logic "low" level.

Figure 4:
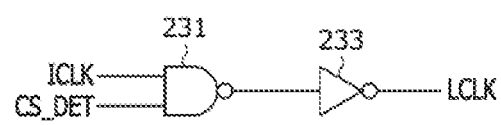
FIG. 4 is a circuit diagram illustrating a latch clock generation circuit included in the electronic device illustrated in FIG. 2.

FIG. 4 is a circuit diagram illustrating an example of the latch clock generation circuit 203. As illustrated in FIG. 4, the latch clock generation circuit 203 may include a NAND gate 231 and an inverter 233 and may receive the detection signal CS_DET and the internal clock ICLK to perform a logical AND operation. The latch clock generation circuit 203 may buffer the internal clock ICLK to output the buffered signal of the internal clock ICLK as the latch clock LCLK when the detection signal CS_DET is activated to have a logic "high" level. The latch clock generation circuit 203 might activate the latch clock LCLK only while the detection signal CS_DET is activated to have a logic "high" level, thereby reducing power consumption.

Figure 5:
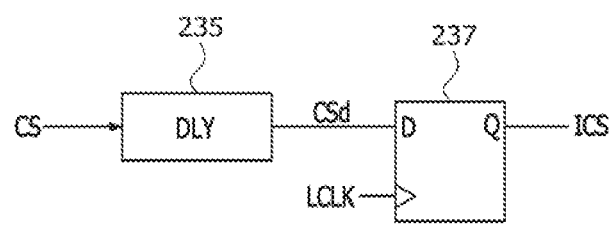
FIG. 5 illustrates a chip selection signal buffer circuit included in the electronic device illustrated in FIG. 2.

FIG. 5 illustrates an example of the chip selection signal buffer circuit 205. As illustrated in FIG. 5, the chip selection signal buffer circuit 205 may include a chip selection signal delayer 235 and a chip selection signal latch 237. The chip selection signal delayer 235 may generate a delayed chip selection signal CSd by delaying the chip selection signal CS. The chip selection signal latch 237 may latch the delayed chip selection signal CSd when the latch clock LCLK is activated and may output the latched signal of the delayed chip selection signal CSd as the internal chip selection signal ICS. The chip selection signal buffer circuit 205 might latch the delayed chip selection signal CSd only when the latch clock LCLK is activated, thereby reducing power consumption.

Figure 6:
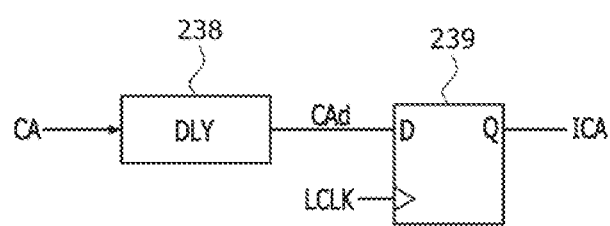
FIG. 6 illustrates a command buffer circuit included in the electronic device illustrated in FIG. 2.

FIG. 6 illustrates an example of the command buffer circuit 207. As illustrated in FIG. 6, the command buffer circuit 207 may include a command delayer 238 and a command latch 239. The command delayer 238 may delay the command CA to generate a delayed command CAd. The command latch 239 may latch the delayed command CAd when the latch clock LCLK is activated and may output the latched signal of the delayed command CAd as the internal command ICA. The command buffer circuit 207 might latch the delayed command CAd only when the latch clock LCLK is activated, thereby reducing power consumption.

Figure 7:
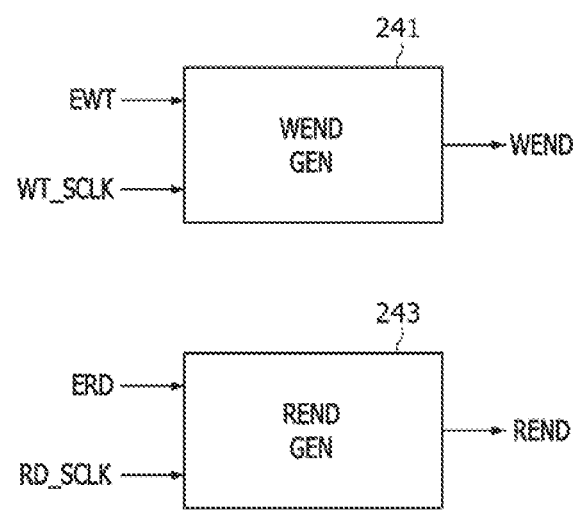
FIG. 7 is a block diagram illustrating a configuration of a latency shifting circuit included in the electronic device illustrated in FIG. 2.

FIG. 7 is a block diagram illustrating a configuration of the latency shifting circuit 211. As illustrated in FIG. 7, the latency shifting circuit 211 may include a write end signal generation circuit 241 and a read end signal generation circuit 243. The write end signal generation circuit 241 may generate the write end signal WEND based on the write signal EWT and the write shifting clock WT_SCLK. The write end signal generation circuit 241 may generate the write end signal WEND maintaining an inactivated state from a point in time when the write signal EWT is activated until a point in time when a period set by a write latency elapses from a point in time when the write signal EWT is activated. For example, when the write latency is set to have eight cycles of the internal clock ICLK, the write end signal generation circuit 241 may generate the write end signal WEND remaining an inactivated state from a point in time when the write signal EWT is activated until a point in time when eight cycles of the internal clock ICLK elapse from a point in time when the write signal EWT is activated. The write end signal WEND may be activated before the write signal EWT is activated or after a point in time when eight cycles of the internal clock ICLK elapse from the point in time when the write signal EWT is activated. The read end signal generation circuit 243 may generate the read end signal REND based on the read signal ERD and the read shifting clock RD_SCLK. The read end signal generation circuit 243 may generate the read end signal REND maintaining an inactivated state from a point in time when the read signal ERD is activated until a point in time when a period set by a read latency elapses from a point in time when the read signal ERD is activated. For example, when the read latency is set to have 16 cycles of the internal clock ICLK, the read end signal generation circuit 243 may generate the read end signal REND remaining an inactivated state from a point in time when the read signal ERD is activated until a point in time when 16 cycles of the internal clock ICLK elapse from a point in time when the read signal ERD is activated. The read end signal REND may be activated before the read signal ERD is activated or after a point in time when 16 cycles of the internal clock ICLK elapse from the point in time the read signal ERD is activated.

Figure 8:
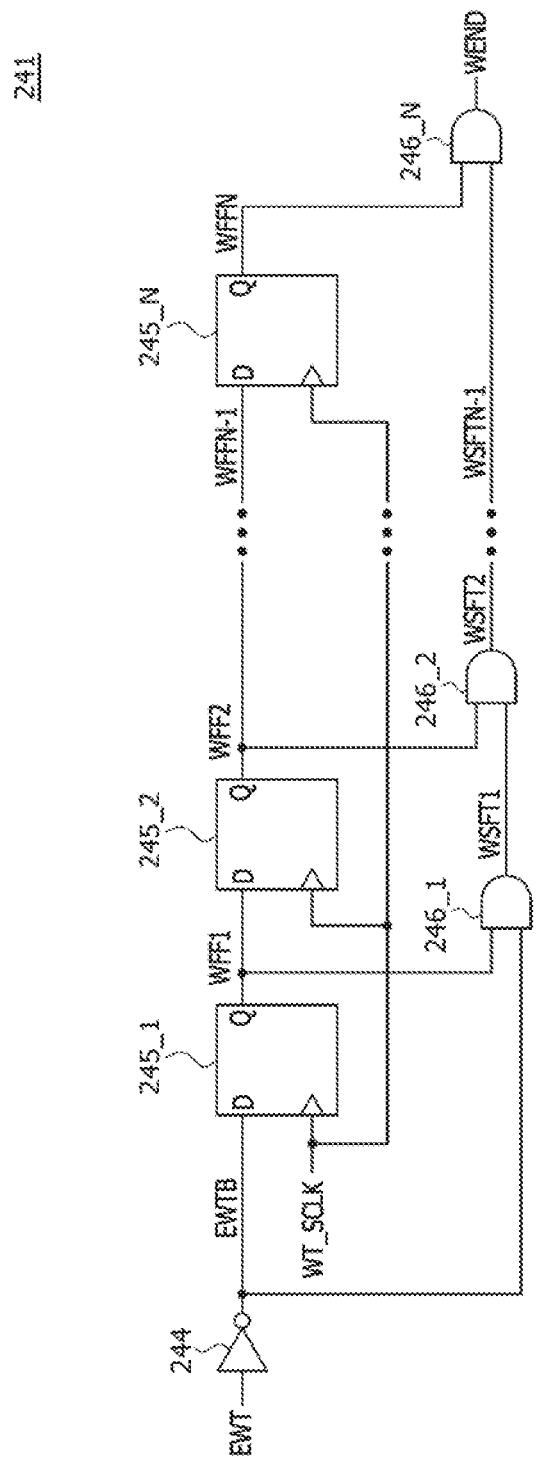
FIG. 8 is a circuit diagram illustrating a write end signal generation circuit included in the latency shifting circuit illustrated in FIG. 7.

FIG. 8 is a circuit diagram illustrating an example of the write end signal generation circuit 241. As illustrated in FIG. 8, the write end signal generation circuit 241 may include an inverter 244, first to $N^{th}$ write shifting latches 245_1 to 245_N, and first to $N^{th}$ AND gates 246_1 to 246_N. The inverter 244 may inversely buffer the write signal EWT to generate an inverted write signal EWTB. The first write shifting latch 245_1 may be synchronized with the write shifting clock WT_SCLK to latch the inverted write signal EWTB and may output the latched signal of the inverted write signal EWTB as a first write latch signal WFF1. The second write shifting latch 245_2 may be synchronized with the write shifting clock WT_SCLK to latch the first write latch signal WFF1 and may output the latched signal of the first write latch signal WFF1 as a second write latch signal WFF2. The $N^{th}$ write shifting latch 245_N may be synchronized with the write shifting clock WT_SCLK to latch an N-1$^{th}$ write latch signal WFFN-1 and may output the latched signal of the N-1$^{th}$ write latch signal WFFN-1 as an $N^{h}$ write latch signal WFFN. The first AND gate 246_1 may perform a logical NAD operation of the inverted write signal EWTB and the first write latch signal WFF1 to generate a first write shifting signal WSFT1. The second AND gate 246_2 may perform a logical AND operation of the first write shifting signal WSFT1 and the second write latch signal WFF2 to generate a second write shifting signal WSFT2. The $N^{th}$ AND gate 246_N may perform a logical AND operation of an (N-1)$^{th}$ write shifting signal WSFTN-1 and the $N^{th}$ write latch signal WFFN to generate the write end signal WEND. The write end signal generation circuit 241 may include the first to $N^{th}$ write shifting latches 245_1 to 245_N and the first to $N^{th}$ AND gates 246_1 to 246_N to perform an operation for shifting the write signal EWT by a period set by the write latency. The number "N" of the first to $N^{th}$ write shifting latches 245_1 to 245_N and the first to $N^{th}$ AND gates 246_1 to 246_N may be set as a natural number which is equal to or greater than two. The write end signal generation circuit 241 may generate the write end signal WEND maintaining an inactivated state from a point in time when the write signal EWT is activated until a point in time when a period set by the write latency elapses from a point in time when the write signal EWT is activated.

Figure 9:
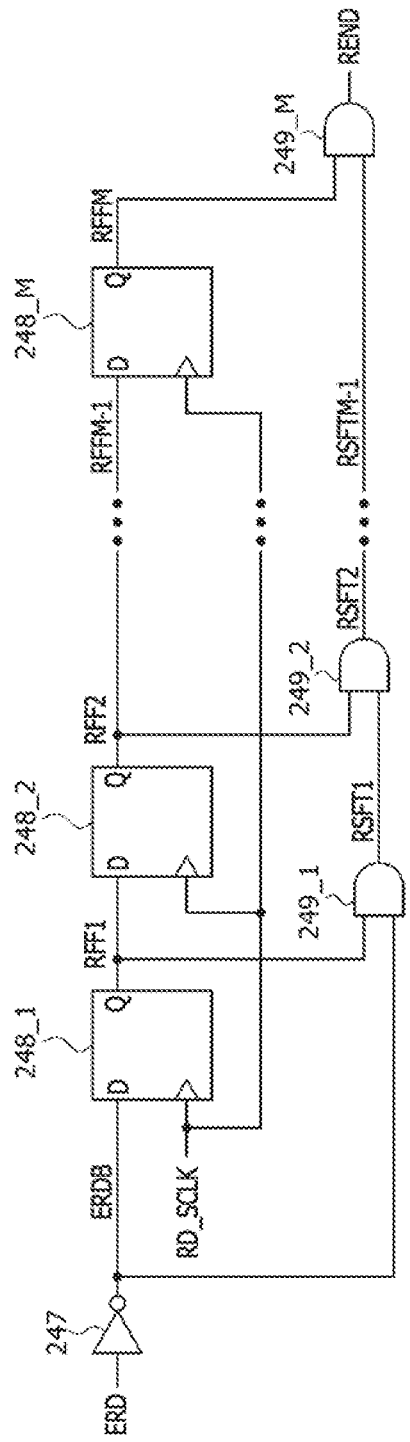
FIG. 9 is a circuit diagram illustrating a read end signal generation circuit included in the latency shifting circuit illustrated in FIG. 7.

FIG. 9 is a circuit diagram illustrating an example of the read end signal generation circuit 243. As illustrated in FIG. 9, the read end signal generation circuit 243 may include an inverter 247, first to $M^{th}$ read shifting latches 248_1 to 248_M, and first to $M^{th}$ AND gates 249_1 to 249_M. The inverter 247 may inversely buffer the read signal ERD to generate an inverted read signal ERDB. The first read shifting latch 248_1 may be synchronized with the read shifting clock RD_SCLK to latch the inverted read signal ERDB and may output the latched signal of the inverted read signal ERDB as a first read latch signal RFF1. The second read shifting latch 248_2 may be synchronized with the read shifting clock RD_SCLK to latch the first read latch signal RFF1 and may output the latched signal of the first read latch signal RFF1 as a second read latch signal RFF2. The $M^{th}$ read shifting latch 248_M may be synchronized with the read shifting clock RD_SCLK to latch an M-1$^{th}$ read latch signal RFFM-1 and may output the latched signal of the M-1$^{th}$ read latch signal RFM-1 as an $M^{th}$ read latch signal RFFM. The first AND gate 249_1 may perform a logical AND operation of the inverted read signal ERDB and the first read latch signal RFF1 to generate a first read shifting signal RSFT1. The second AND gate 249_2 may perform a logical AND operation of the first read shifting signal RSFT1 and the second read latch signal RFF2 to generate a second read shifting signal RSFT2. The $M^{h}$ AND gate 249_M may perform a logical AND operation of an (M-1)$^{th}$ read shifting signal RSFTM-1 and the $M^{th}$ read latch signal RFFM to generate the read end signal REND. The read end signal generation circuit 243 may include the first to $M^{th}$ read shifting latches 248_1 to 248_M and the first to $M^{th}$ AND gates 249_1 to 249_M to perform an operation for shifting the read signal ERD by a period set by the read latency. The number "M" of the first to $M^{th}$ read shifting latches 248_1 to 248_M and the first to $M^{h}$ AND gates 249_1 to 249_M may be set as a natural number which is equal to or greater than two. The read end signal generation circuit 243 may generate the read end signal REND maintaining an inactivated state from a point in time when the read signal ERD is activated until a point in time when a period set by the read latency elapses from a point in time when the read signal ERD is activated.

Figure 10:
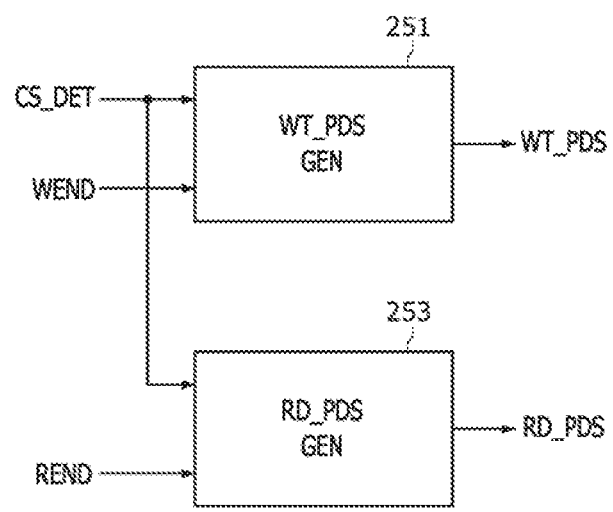
FIG. 10 is a block diagram illustrating a configuration of a period signal generation circuit included in the electronic device illustrated in FIG. 2.

FIG. 10 is a block diagram illustrating a configuration of an example of the period signal generation circuit 213. As illustrated in FIG. 10, the period signal generation circuit 213 may include a write period signal generation circuit 251 and a read period signal generation circuit 253. The write period signal generation circuit 251 may generate a write period signal WT_PDS based on the detection signal CS_DET and the write end signal WEND. The write period signal generation circuit 251 may activate the write period signal WT_PDS when the detection signal CS_DET is activated. The write period signal generation circuit 251 may inactivate the write period signal WT_PDS when the detection signal CS_DET is inactivated and the write end signal WEND is activated. The read period signal generation circuit 253 may generate the read period signal RD_PDS based on the detection signal CS_DET and the read end signal REND. The read period signal generation circuit 253 may activate the read period signal RD_PDS when the detection signal CS_DET is activated. The read period signal generation circuit 253 may inactivate the read period signal RD_PDS when the detection signal CS_DET is inactivated and the read end signal REND is activated.

Figure 11:
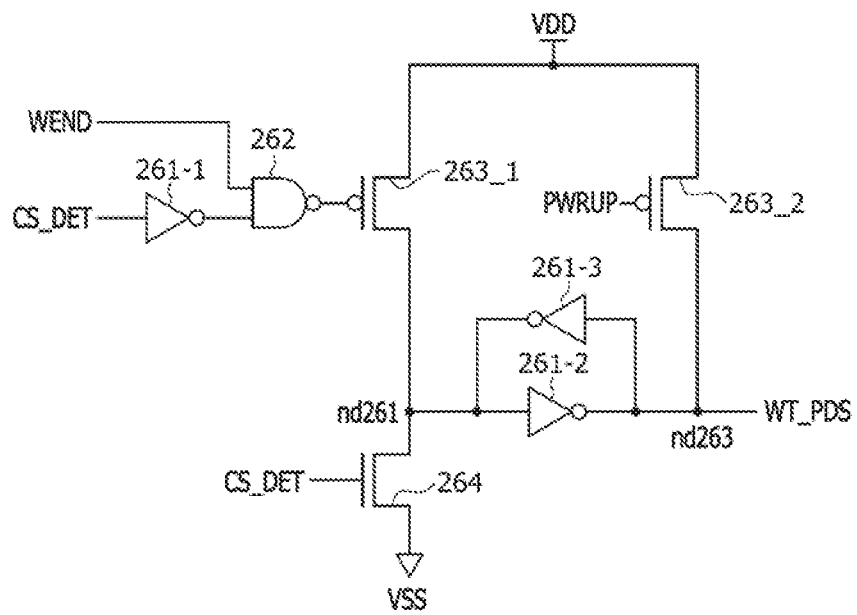
FIG. 11 is a circuit diagram illustrating a write period signal generation circuit included in the period signal generation circuit illustrated in FIG. 10.

FIG. 11 is a circuit diagram illustrating an example of the write period signal generation circuit 251. As illustrated in FIG. 11, the write period signal generation circuit 251 may include inverters 261_1 to 261_3, a NAND gate 262, PMOS transistors 263_1 and 263_2, and an NMOS transistor 264. The inverter 261_1 may inversely buffer the detection signal CS_DET to output the inversely buffered signal of the detection signal CS_DET. The NAND gate 262 may perform a logical NAND operation of the write end signal WEND and an output signal of the inverter 261_1. When the detection signal CS_DET is inactivated to have a logic "low" level and the write end signal WEND is activated to have a logic "high" level, the PMOS transistor 263_1 may be turned on by an output signal of the NAND gate 262, which is generated to have a logic "low" level, to drive a node nd261 to a logic "high" level corresponding to a power supply voltage VDD. The inverters 261_2 and 261_3 may be coupled between the node nd261 and a node nd263 to function as a latch circuit that latches a signal of the node nd261 and a signal of the node nd263. The PMOS transistor 263_2 may be turned on by a power-up signal PWRUP during a power-up period to initialize the node nd263 to a logic "high" level corresponding to the power supply voltage VDD. The power-up signal PWRUP may be set to have a logic "low" level during a power-up period in which the power supply voltage VDD increases from a ground voltage to a predetermined voltage and may be set to have a logic "high" level after the power-up period terminates. When the detection signal CS_DET is activated to have a logic "high" level, the NMOS transistor 264 may be turned on to drive the node nd261 to drive the node nd261 to a logic "low" level corresponding to a ground voltage VSS. In the write period signal generation circuit 251, the write period signal WT_PDS may be activated to have a logic "high" level by the NMOS transistor 264 which is turned on when the detection signal CS_DET is activated to have a logic "high" level. In the write period signal generation circuit 251, the write period signal WT_PDS may be inactivated to have a logic "low" level by the PMOS transistor 263_1 which is turned on when the detection signal CS_DET is inactivated to have a logic "low" level while the write end signal WEND activated to have a logic "high" level is inputted because no write operation is performed. When the detection signal CS_DET is inactivated to have a logic "low" level and the write end signal WEND is activated to a logic "high" level due to termination of the write operation, the write period signal generation circuit 251 may inactivate the write period signal WT_PDS to a logic "low" level. The write period signal WT_PDS may be activated during a relatively longer period when the write operation is performed, as compared with the cases that the active operation, the read operation, and the pre-charge operation are performed.

Figure 12:
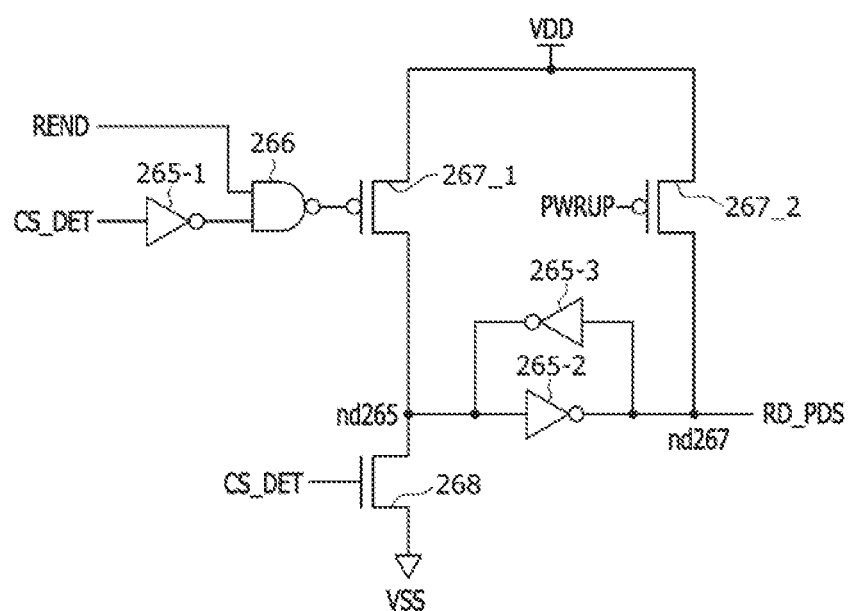
FIG. 12 is a circuit diagram illustrating a read period signal generation circuit included in the period signal generation circuit illustrated in FIG. 10.

FIG. 12 is a circuit diagram illustrating an example of the read period signal generation circuit 253. As illustrated in FIG. 12, the read period signal generation circuit 253 may include inverters 265_1 to 265_3, a NAND gate 266, PMOS transistors 267_1 and 267_2, and an NMOS transistor 268. The inverter 265_1 may inversely buffer the detection signal CS_DET to output the inversely buffered signal of the detection signal CS_DET. The NAND gate 266 may perform a logical NAND operation of the read end signal REND and an output signal of the inverter 265_1. When the detection signal CS_DET is inactivated to have a logic "low" level and the write end signal WEND is activated to have a logic "high" level, the PMOS transistor 267_1 may be turned on by an output signal of the NAND gate 266, which is generated to have a logic "low" level, to drive a node nd265 to a logic "high" level corresponding to the power supply voltage VDD. The inverters 265_2 and 265_3 may be coupled between the node nd265 and a node nd267 to function as a latch circuit that latches a signal of the node nd265 and a signal of the node nd267. The PMOS transistor 267_2 may be turned on by the power-up signal PWRUP during the power-up period to initialize the node nd267 to a logic "high" level corresponding to the power supply voltage VDD. When the detection signal CS_DET is activated to have a logic "high" level, the NMOS transistor 268 may be turned on to drive the node nd265 to a logic "low" level corresponding to the ground voltage VSS. In the read period signal generation circuit 253, the read period signal RD_PDS may be activated to have a logic "high" level by the NMOS transistor 268 that is turned on when the detection signal CS_DET is activated to have a logic "high" level. In the read period signal generation circuit 253, the read period signal RD_PDS may be inactivated to have a logic "low" level by the PMOS transistor 267-1 that is turned on when the detection signal CS_DET is inactivated to have a logic "low" level while the read end signal REND activated to have a logic "high" level is inputted because no read operation is performed. The read period signal generation circuit 253 may inactivate the read period signal RD_PDS to a logic "low" level when the detection signal CS_DET is inactivated to have a logic "low" level and the read end signal REND is activated to a logic "high" level due to termination of the read operation. The read period signal RD_PDS may be activated during a relatively longer period when the read operation is performed, as compared with the cases that the active operation, the read operation, and the pre-charge operation are performed.

Figure 13:
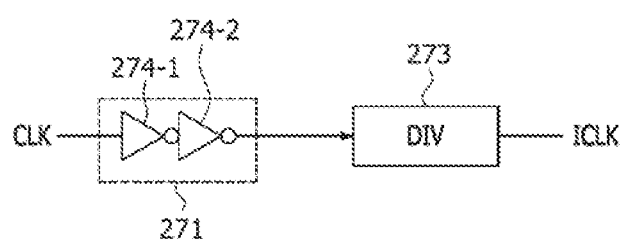
FIG. 13 illustrates a clock buffer circuit included in the electronic device illustrated in FIG. 2.

FIG. 13 illustrates an example of the clock buffer circuit 215. As illustrated in FIG. 13, the clock buffer circuit 215 may include an input buffer 271 and a divider (DIV) 273. The input buffer 271 may include inverters 274_1 and 274_2 and may buffer the clock CLK to output a buffered signal of the clock CLK. The divider 273 may divide an output signal of the input buffer 271 to generate the internal clock ICLK. A cycle of the internal clock ICLK may be set to be equal to "J" (wherein, "J" denotes a natural number which is equal to or greater than two) times a cycle of the clock CLK.

Figure 14:
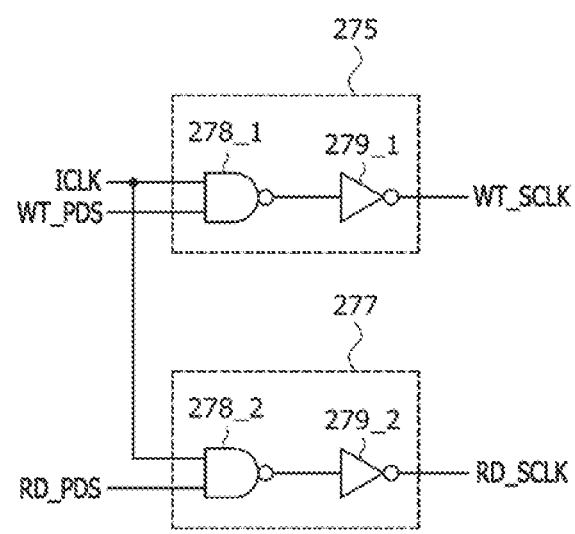
FIG. 14 is a circuit diagram illustrating a shifting clock generation circuit included in the electronic device illustrated in FIG. 2.

FIG. 14 is a circuit diagram illustrating an example of the shifting clock generation circuit 217. As illustrated in FIG. 14, the shifting clock generation circuit 217 may include a write shifting clock generation circuit 275 and a read shifting clock generation circuit 277. The write shifting clock generation circuit 275 may include a NAND gate 278_1 and an inverter 279_1 and may perform a logical AND operation of the internal clock ICLK and the write period signal WT_PDS to generate the write shifting clock WT_SCLK. The write shifting clock generation circuit 275 may buffer the internal clock ICLK to output the buffered signal of the internal clock ICLK as the write shifting clock WT_SCLK while the write period signal WT_PDS is activated. The read shifting clock generation circuit 277 may include a NAND gate 278_2 and an inverter 279_2 and may perform a logical AND operation of the internal clock ICLK and the read period signal RD_PDS to generate the read shifting clock RD_SCLK. The read shifting clock generation circuit 277 may buffer the internal clock ICLK to output the buffered signal of the internal clock ICLK as the read shifting clock RD_SCLK while the read period signal RD_PDS is activated.

Figure 15:
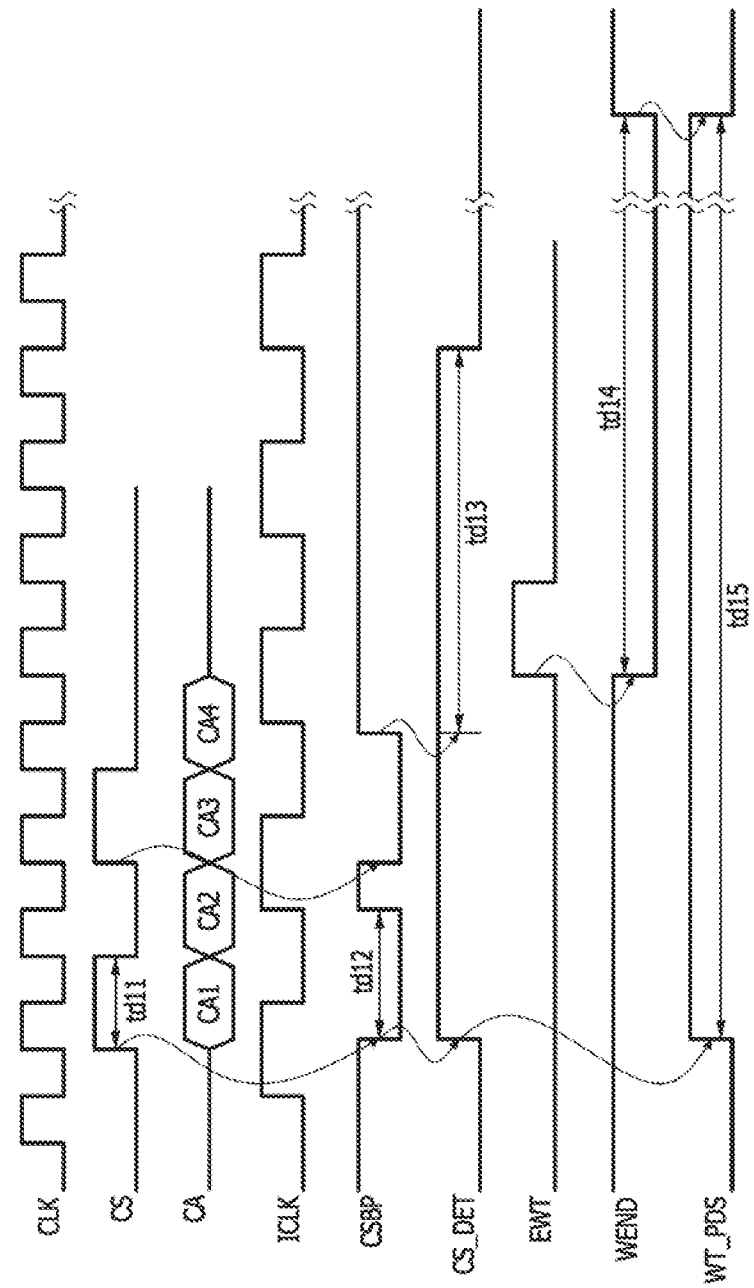
FIGS. 15 and 16 are timing diagrams illustrating an operation of the electronic device illustrated in FIG. 2.
Figure 16:
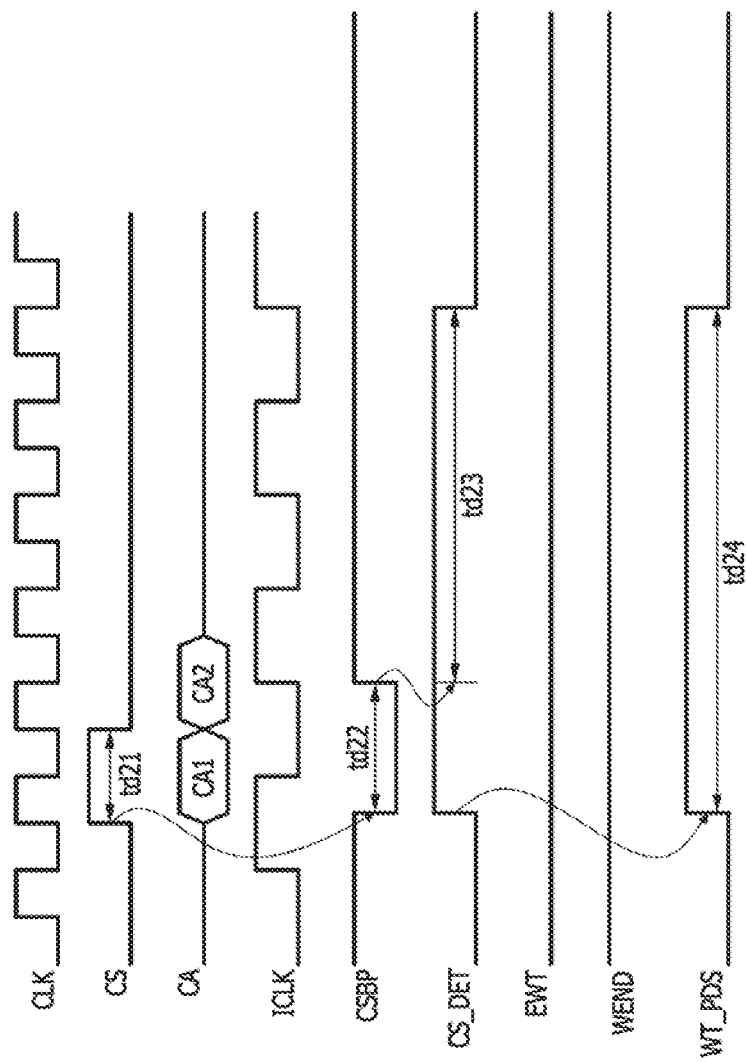

FIGS. 15 and 16 are timing diagrams illustrating an operation of the electronic device 120 illustrated in FIG. 2.

As illustrated in FIG. 15, the write signal EWT may be generated to perform the write operation when the chip selection signal CS and the command CA including first to fourth commands CA1 to CA4 are inputted in synchronization with the clock CLK. The chip selection pulse signal CSBP may be set to have a logic "low" level when the chip selection signal CS is activated from a logic "low" level into a logic "high" level, and a logic level of the chip selection pulse signal CSBP may change from a logic "low" level into a logic "high" level at a point in time when a predetermined period elapses from a point in time when the chip selection signal CS is inactivated from a logic "high" level to a logic "low" level. The chip selection pulse signal CSBP is generated to have a logic "low" level during a period td12 based on the chip selection signal CS which is activated to have a logic "high" level during a period td11. In addition, the chip selection pulse signal CSBP may also be set to have a logic "low" level based on the chip selection signal CS which is activated a second time. The detection signal CS_DET may be activated to have a logic "high" level when the chip selection pulse signal CSBP is generated to have a logic "low" level. The latch clock LCLK for latching the chip selection signal CS and the command CA may be activated from a point in time when the detection signal CS_DET is activated to have a logic "high" level. Accordingly, the latch clock LCLK may be set to be activated after the detection signal CS_DET is activated, thereby reducing unnecessary power consumption. When the chip selection signal CS is repeatedly and sequentially activated in synchronization with the clock CLK, the detection signal CS_DET may maintain an activated state having a logic "high" level during a period from a point in time when a logic level of the chip selection pulse signal CSBP changes from a logic "low" level into a logic "high" level a second time until a point in time when a period td13 elapses from the point in time when a logic level of the chip selection pulse signal CSBP changes from a logic "low" level into a logic "high" level a second time. The write end signal WEND may be inactivated to have a logic "low" level from a point in time when the write signal EWT is generated to have a logic "high" level until a point in time when a period td14 set by the write latency elapses from the point in time when the write signal EWT is generated to have a logic "high" level. When the write end signal WEND is generated, an operation of shifting by a period set by the write latency may be performed based on the shifting clock SCLK and the shifting clock SCLK may be generated when the detection signal CS_DET is activated to have a logic "high" level. Thus, it may be possible to reduce power consumption during the write operation. The write period signal WT_PDS may be activated to have a logic "high" level when the detection signal CS_DET is activated to have a logic "high" level and may be inactivated to have a logic "low" level when the detection signal CS_DET is inactivated to have a logic "low" level and the write end signal WEND is activated to have a logic "high" level. The write period signal WT_PDS may maintain an activated state having a logic "high" level during a period td15.

As illustrated in FIG. 16, the active operation or the pre-charge operation may be performed when the chip selection signal CS and the command CA including first and second commands CA1 and CA2 are inputted in synchronization with the clock CLK. The chip selection pulse signal CSBP may be set to have a logic "low" level when the chip selection signal CS is activated from a logic "low" level into a logic "high" level, and a level of the chip selection pulse signal CSBP may change from a logic "low" level into a logic "high" level at a point in time when a predetermined period elapses from a point in time when the chip selection signal CS is inactivated from a logic "high" level to a logic "low" level. The chip selection pulse signal CSBP may be set to have a logic "low" level during a period td22 based on the chip selection signal CS that is activated to have a logic "high" level during a period td21. The detection signal CS_DET may be activated to have a logic "high" level when the chip selection pulse signal CSBP is generated to have a logic "low" level. The latch clock LCLK for latching the chip selection signal CS and the command CA may be activated from a point in time when the detection signal CS_DET is activated to have a logic "high" level. When the chip selection signal CS is activated in synchronization with the clock CLK, the detection signal CS_DET may maintain an activated state having a logic "high" level during a period from a point in time when a logic level of the chip selection pulse signal CSBP changes from a logic "low" level into a logic "high" level until a point in time when a period td23 elapses from the point in time when a logic level of the chip selection pulse signal CSBP changes from a logic "low" level into a logic "high" level. The write end signal WEND may maintain an enabled state having a logic "high" level because no write operation is performed. The write period signal WT_PDS may be activated to have a logic "high" level when the detection signal CS_DET is activated to have a logic "high" level and may be inactivated to have a logic "low" level when the detection signal CS_DET is inactivated to have a logic "low" level. The write period signal WT_PDS may maintain an activated state having a logic "high" level for a period td24. The period td24 during which the write period signal WT_PDS is activated to have a logic "high" level when the write operation is not performed may be set to be relatively shorter than the period td15 during which the write period signal WT_PDS is activated to have a logic "high" level when the write operation is performed.

Figure 17:
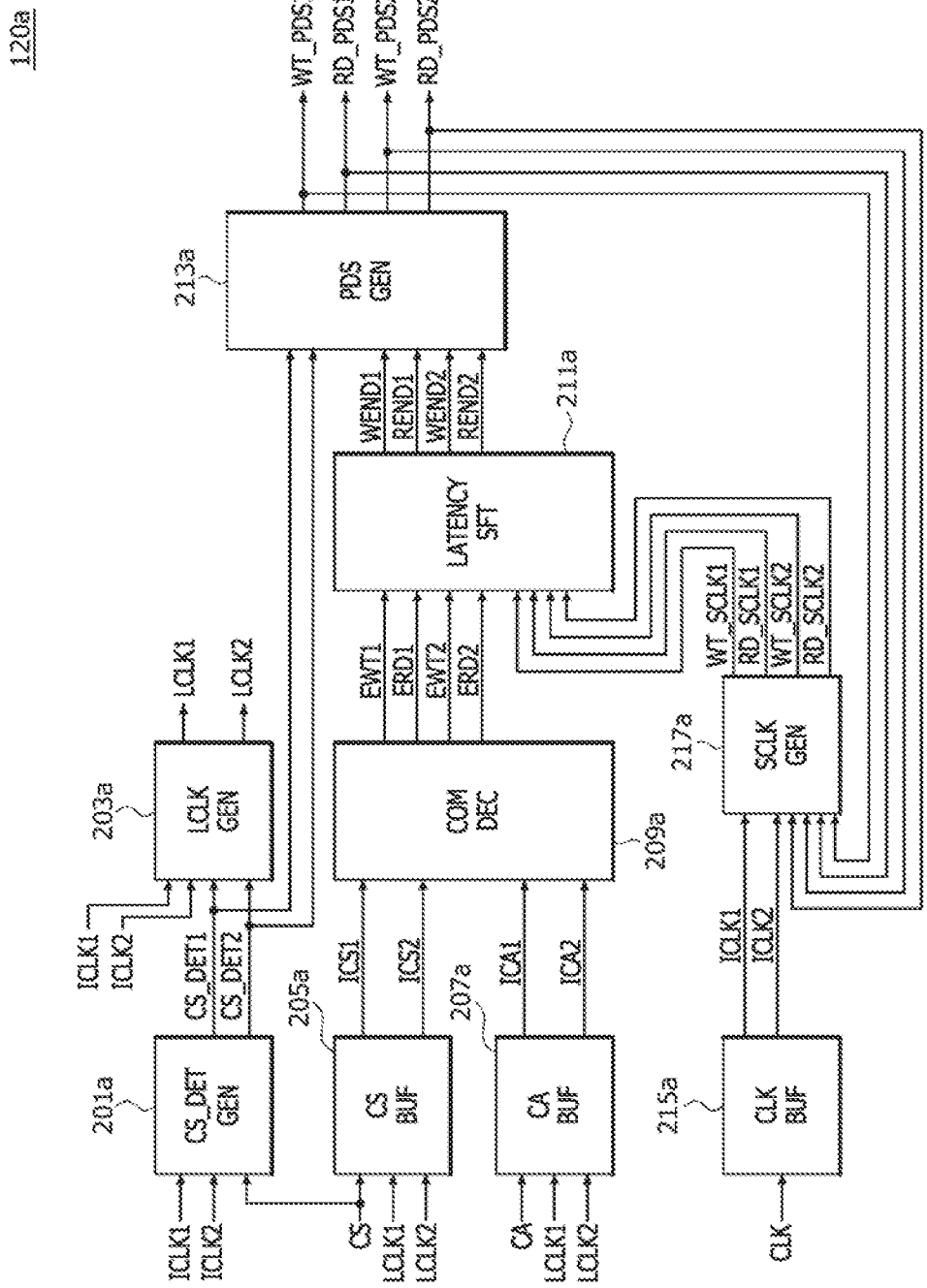
FIG. 17 is a block diagram illustrating a configuration of another example of the electronic device included in the electronic system illustrated in FIG. 1.

FIG. 17 is a block diagram illustrating a configuration of an electronic device 120a corresponding to another example of the electronic device 120 included in the electronic system 100 illustrated in FIG. 1. As illustrated in FIG. 17, the electronic device 120a may include a detection signal generation circuit (CS_DET GEN) 201a, a latch clock generation circuit (LCLK GEN) 203a, a chip selection signal buffer circuit (CS BUF) 205a, a command buffer circuit (CA BUF) 207a, a command decoder (COM DEC) 209a, a latency shifting circuit (LATENCY SFT) 211a, a period signal generation circuit (PDS GEN) 213a, a clock buffer circuit (CLK BUF) 215a, and a shifting clock generation circuit (SCLK GEN) 217a.

The detection signal generation circuit 201a may generate a first detection signal CS_DET1 and a second detection signal CS_DET2 based on a first internal clock ICLK1, a second internal clock ICLK2, and a chip selection signal CS. The detection signal generation circuit 201a may activate the first detection signal CS_DET1 and the second detection signal CS_DET2 when the chip selection signal CS is activated. When the chip selection signal CS is inactivated after being activated, the detection signal generation circuit 201a may inactivate the first detection signal CS_DET1 at a point in time when the predetermined number of cycles of the first internal clock ICLK1 elapses from a point in time when the chip selection signal CS is inactivated. For example, the first detection signal CS_DET1 may be inactivated at a point in time when two cycles of the first internal clock ICLK1 elapse from a point in time when the chip selection signal CS is inactivated. When the chip selection signal CS is inactivated after being activated, the detection signal generation circuit 201a may inactivate the second detection signal CS_DET2 at a point in time when the predetermined number of cycles of the second internal clock ICLK2 elapses from a point in time when the chip selection signal CS is inactivated. For example, the second detection signal CS_DET2 may be inactivated at a point in time when two cycles of the second internal clock ICLK2 elapse from a point in time when the chip selection signal CS is inactivated.

The latch clock generation circuit 203a may generate a first latch clock LCLK1 and a second latch clock LCLK2 based on the first detection signal CS_DET1, the second detection signal CS_DET2, the first internal clock ICLK1, and the second internal clock ICLK2. The latch clock generation circuit 203a may buffer the first internal clock ICLK1 to output the buffered signal of the first internal clock ICLK1 as the first latch clock LCLK1 when the first detection signal CS_DET1 is activated. The latch clock generation circuit 203a may activate the first latch clock LCLK1 while the first detection signal CS_DET1 is activated. The latch clock generation circuit 203a may buffer the second internal clock ICLK2 to output the buffered signal of the second internal clock ICLK2 as the second latch clock LCLK2 when the second detection signal CS_DET2 is activated. The latch clock generation circuit 203a may activate the second latch clock LCLK2 while the second detection signal CS_DET2 is activated.

The chip selection signal buffer circuit 205a may generate a first internal chip selection signal ICS1 and a second internal chip selection signal ICS2 based on the first latch clock LCLK1, the second latch clock LCLK2, and the chip selection signal CS. When the first latch clock LCLK1 is activated, the chip selection signal buffer circuit 205a may latch the chip selection signal CS to output the latched signal of the chip selection signal CS as the first internal chip selection signal ICS1. When the second latch clock LCLK2 is activated, the chip selection signal buffer circuit 205a may latch the chip selection signal CS to output the latched signal of the chip selection signal CS as the second internal chip selection signal ICS2. The chip selection signal buffer circuit 205a might latch the chip selection signal CS only when the first latch clock LCLK1 and the second latch clock LCLK2 are activated, thereby reducing power consumption.

The command buffer circuit 207a may generate a first internal command ICA1 and a second internal command ICA2 based on the first latch clock LCLK1, the second latch clock LCLK2, and a command CA. When the first latch clock LCLK1 is activated, the command buffer circuit 207a may latch the command CA to output the latched signal of the command CA as the first internal command ICAL. When the second latch clock LCLK2 is activated, the command buffer circuit 207a may latch the command CA to output the latched signal of the command CA as the second internal command ICA2. The command buffer circuit 207a might latch the command CA only when the first latch clock LCLK1 and the second latch clock LCLK2 are activated, thereby reducing power consumption.

The command decoder 209a may generate internal operation signals based on the first internal chip selection signal ICS1, the second internal chip selection signal ICS2, the first internal command ICA1, and the second internal command ICA2. The internal operation signals may include a first write signal EWT1, a second write signal EWT2, a first read signal ERD1, and a second read signal ERD2. The command decoder 209a may generate the first write signal EWT1 and the first read signal ERD1 by decoding the first internal command ICA1 based on the first internal chip selection signal ICS1. The command decoder 209a may activate the first write signal EWT1 and the first read signal ERD1 by decoding the first internal command ICA1 sequentially inputted based on the first internal chip selection signal ICS1. For example, the first write signal EWT1 may be activated when the first internal command ICA1 having a first logic level combination is inputted based on the first internal chip selection signal ICS1, and the first read signal ERD1 may be activated when the first internal command ICA1 having a second logic level combination is inputted based on the first internal chip selection signal ICS1. The command decoder 209a may generate the second write signal EWT2 and the second read signal ERD2 by decoding the second internal command ICA2 based on the second internal chip selection signal ICS2. The command decoder 209a may activate the second write signal EWT2 and the second read signal ERD2 by decoding the second internal command ICA2 sequentially inputted based on the second internal chip selection signal ICS2. The first write signal EWT1 and the second write signal EWT2 may be activated to perform a write operation. The first read signal ERD1 and the second read signal ERD2 may be activated to perform a read operation.

The latency shifting circuit 211a may generate end signals based on the first write signal EWT1, the second write signal EWT2, the first read signal ERD1, the second read signal ERD2, a first write shifting clock WT_SCLK1, a second write shifting clock WT_SCLK2, a first read shifting clock RD_SCLK1, and a second read shifting clock RD_SCLK2. The end signals may include a first write end signal WEND1, a second write end signal WEND2, a first read end signal REND1, and a second read end signal REND2. The latency shifting circuit 211a may generate the first write end signal WEND1 that maintains an inactivated state from a point in time when the first write signal EWT1 is activated until a point in time when a period set by a write latency elapses from a point in time when the first write signal EWT1 is activated. The first write end signal WEND1 may be activated while the write operation is not performed. The first write end signal WEND1 may maintain an inactivated state during a period set by the write latency through a shifting operation performed based on the first write shifting clock WT_SCLK1. The latency shifting circuit 211a may generate the second write end signal WEND2 that maintains an inactivated state from a point in time when the second write signal EWT2 is activated until a point in time when a period set by the write latency elapses from a point in time when the second write signal EWT2 is activated. The second write end signal WEND2 may be activated while the write operation is not performed. The second write end signal WEND2 may maintain an inactivated state during a period set by the write latency through a shifting operation performed based on the second write shifting clock WT_SCLK2. The latency shifting circuit 211a may generate the first read end signal REND1 that maintains an inactivated state from a point in time when the first read signal ERD1 is activated until a point in time when a period set by a read latency based on the first read shifting clock RD_SCLK1 elapses from a point in time when the first read signal ERD1 is activated. The first read end signal REND1 may be activated while the read operation is not performed. The first read end signal REND1 may maintain an inactivated state during a period set by the read latency through a shifting operation performed based on the first read shifting clock RD_SCLK1. The latency shifting circuit 211*a* may generate the second read end signal REND2 that maintains an inactivated state from a point in time when the second read signal ERD2 is activated until a point in time when a period set by the read latency based on the second read shifting clock RD_SCLK2 elapses from a point in time when the second read signal ERD2 is activated. The second read end signal REND2 may be activated while the read operation is not performed. The second read end signal REND2 may maintain an inactivated state during a period set by the read latency through a shifting operation performed based on the second read shifting clock RD_SCLK2.

The period signal generation circuit 213*a* may generate period signals based on the first detection signal CS_DET1, the second detection signal CS_DET2, the first write end signal WEND1, the second write end signal WEND2, the first read end signal REND1, and the second read end signal REND2. The period signals may include a first write period signal WT_PDS1, a second write period signal WT_PDS2, a first read period signal RD_PDS1, and a second read period signal RD_PDS2. The period signal generation circuit 213*a* may activate the first write period signal WT_PDS1 and the first read period signal RD_PDS1 when the first detection signal CS_DET1 is activated. The period signal generation circuit 213*a* may inactivate the first write period signal WT_PDS1 when the first detection signal CS_DET1 is inactivated and the first write end signal WEND1 is activated. The first write period signal WT_PDS1 may be set to be activated during a relatively longer period when the write operation is performed, as compared with cases that the active operation, the read operation, and the pre-charge operation are performed. The period signal generation circuit 213*a* may inactivate the first read period signal RD_PDS1 when the first detection signal CS_DET1 is inactivated and the first read end signal REND1 is activated. The first read period signal RD_PDS1 may be set to be activated during a relatively longer period when the read operation is performed, as compared with cases that the active operation, the write operation, and the pre-charge operation are performed. The period signal generation circuit 213*a* may activate the second write period signal WT_PDS2 and the second read period signal RD_PDS2 when the second detection signal CS_DET2 is activated. The period signal generation circuit 213*a* may inactivate the second write period signal WT_PDS2 when the second detection signal CS_DET2 is inactivated and the second write end signal WEND2 is activated. The second write period signal WT_PDS2 may be set to be activated during a relatively longer period when the write operation is performed, as compared with cases that the active operation, the read operation, and the pre-charge operation are performed. The period signal generation circuit 213*a* may inactivate the second read period signal RD_PDS2 when the second detection signal CS_DET2 is inactivated and the second read end signal REND2 is activated. The second read period signal RD_PDS2 may be set to be activated during a relatively longer period when the read operation is performed, as compared with cases that the active operation, the write operation, and the pre-charge operation are performed.

The clock buffer circuit 215*a* may generate the first internal clock ICLK1 and the second internal clock ICLK2 based on a clock CLK. The clock buffer circuit 215*a* may generate the first internal clock ICLK1 and the second internal clock ICLK2 by dividing the clock CLK. A cycle of each of the first and second internal clocks ICLK1 and ICLK2 may be set to be equal to "I" (wherein, "I" denotes a natural number which is equal to or greater than two) times a cycle of the clock CLK. A level transition of the first internal clock ICLK1 may occur in synchronization with a rising edge of the clock CLK, a level transition of the second internal clock ICLK2 may occur in synchronization with a falling edge of the clock CLK.

The shifting clock generation circuit 217*a* may generate shifting clocks based on the first internal clock ICLK1, the second internal clock ICLK2, the first write period signal WT_PDS1, the second write period signal WT_PDS2, the first read period signal RD_PDS1, and the second read period signal RD_PDS2. The shifting clocks may include the first write shifting clock WT_SCLK1, the second write shifting clock WT_SCLK2, the first read shifting clock RD_SCLK1, and the second read shifting clock RD_SCLK2. The shifting clock generation circuit 217*a* may buffer the first internal clock ICLK1 to output the buffered signal of the first internal clock ICLK1 as the first write shifting clock WT_SCLK1 while the first write period signal WT_PDS1 is activated. The shifting clock generation circuit 217*a* may buffer the second internal clock ICLK2 to output the buffered signal of the second internal clock ICLK2 as the second write shifting clock WT_SCLK2 while the second write period signal WT_PDS2 is activated. The shifting clock generation circuit 217*a* may buffer the first internal clock ICLK1 to output the buffered signal of the first internal clock ICLK1 as the first read shifting clock RD_SCLK1 while the first read period signal RD_PDS1 is activated. The shifting clock generation circuit 217*a* may buffer the second internal clock ICLK2 to output the buffered signal of the second internal clock ICLK2 as the second read shifting clock RD_SCLK2 while the second read period signal RD_PDS2 is activated.

Concepts have been disclosed in conjunction with some embodiments as described above. Those skilled in the art will appreciate that various modifications, additions, and substitutions are possible, without departing from the scope and spirit of the present disclosure. Accordingly, the embodiments disclosed in the present specification should be considered from not a restrictive standpoint but rather from an illustrative standpoint. The scope of the concepts is not limited to the above descriptions but defined by the accompanying claims, and all of distinctive features in the equivalent scope should be construed as being included in the concepts.

What is claimed is:

1. An electronic device comprising:
   a latch clock generation circuit configured to generate a latch clock based on a chip selection signal;
   a command decoder configured to generate an internal operation signal from an internal chip selection signal and an internal command generated based on the latch clock; and
   a latency shifting circuit configured to generate an end signal by shifting the internal operation signal in synchronization with a shifting clock by a period corresponding to a latency while an internal operation is performed.

2. The electronic device of claim 1, wherein the latch clock is generated from an internal clock when the chip selection signal is activated.

3. The electronic device of claim 2, wherein the internal clock is generated by dividing a clock.

4. The electronic device of claim 1, further comprising a detection signal generation circuit configured to generate a detection signal that is activated from a point in time when the chip selection signal is activated until a point in time when a period set by an internal clock elapses from the point in time when the chip selection signal is activated.

5. The electronic device of claim 4, wherein the detection signal generation circuit includes:
   a chip selection pulse generation circuit configured to generate a chip selection pulse signal while the chip selection signal is activated; and
   a detection signal output circuit configured to generate the detection signal by performing a shifting operation of the chip selection pulse signal based on the internal clock.

6. The electronic device of claim 4, wherein the detection signal is activated in a power-down mode.

7. The electronic device of claim 1, wherein the internal operation signal includes a write signal generated for a write operation and a read signal generated for a read operation.

8. The electronic device of claim 1, wherein the shifting clock is generated from an internal clock when the chip selection signal is activated.

9. The electronic device of claim 1, wherein the latency shifting circuit includes:
   a shifting latch configured to generate a latch signal by latching an inverted signal of the internal operation signal in synchronization with the shifting clock; and
   a logic element configured to perform a logical operation of the latch signal and the inverted signal of the internal operation signal.

10. The electronic device of claim 1, wherein the end signal includes a write end signal and a read end signal.

11. The electronic device of claim 1, further comprising a period signal generation circuit configured to:
    generate a period signal that is activated when the chip selection signal is activated; and
    generate the period signal that is inactivated based on a detection signal and the end signal.

12. An electronic device comprising:
    a detection signal generation circuit configured to generate a detection signal that is activated from a point in time when a chip selection signal is activated until a point in time when a period set by an internal clock elapses from the point in time when a chip selection signal is activated;
    a latch clock generation circuit configured to generate a latch clock from the detection signal and the internal clock; and
    a command decoder configured to generate an internal operation signal from an internal chip selection signal and an internal command which are generated based on the latch clock.

13. The electronic device of claim 12, wherein the internal clock is generated by dividing a clock.

14. The electronic device of claim 12, wherein the detection signal is activated in a power-down mode.

15. The electronic device of claim 12, further comprising a latency shifting circuit configured to generate an end signal by shifting the internal operation signal in synchronization with a shifting clock by a period corresponding to a latency while an internal operation is performed.

16. The electronic device of claim 15, wherein the shifting clock is generated from the internal clock when the chip selection signal is activated.

17. The electronic device of claim 15, wherein the end signal includes a write end signal and a read end signal.

18. The electronic device of claim 15, further comprising a period signal generation circuit configured to:
    generate a period signal that is activated when the chip selection signal is activated; and
    generate the period signal that is inactivated based on the detection signal and the end signal.

19. The electronic device of claim 18, wherein the period signal includes a write period signal and a read period signal.

20. An electronic device comprising:
    a latch clock generation circuit configured to generate a first latch clock and a second latch clock based on a chip selection signal;
    a command decoder configured to generate a first internal operation signal and a second internal operation signal from a first internal chip selection signal, a second internal chip selection signal, a first internal command, and a second internal command which are generated based on the first latch clock and the second latch clock; and
    a latency shifting circuit configured to generate a first end signal and a second end signal by shifting the first internal operation signal and the second internal operation signal in synchronization with a first shifting clock and a second shifting clock by a period corresponding to a latency while an internal operation is performed.

21. The electronic device of claim 20, wherein the first latch clock and the second latch clock are generated from a first internal clock and a second internal clock when the chip selection signal is activated.

22. The electronic device of claim 20,
    wherein the first internal clock and the second internal clock are generated by dividing a clock;
    wherein a logic level transition of the first internal clock occurs in synchronization with a first edge of the clock; and
    wherein a logic level transition of the second internal clock occurs in synchronization with a second edge of the clock.

23. The electronic device of claim 20, wherein the first shifting clock and the second shifting clock are generated from a first internal clock and a second internal clock when the chip selection signal is activated.

* * * * *